United States Patent
Kim et al.

(10) Patent No.: US 12,016,188 B2
(45) Date of Patent: Jun. 18, 2024

(54) SEMICONDUCTOR MEMORY DEVICE

(71) Applicant: Samsung Electronics Co., Ltd., Suwon-si (KR)

(72) Inventors: Hyuncheol Kim, Seoul (KR); Yongseok Kim, Suwon-si (KR); Dongsoo Woo, Seoul (KR); Kyunghwan Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 183 days.

(21) Appl. No.: 17/840,213

(22) Filed: Jun. 14, 2022

(65) Prior Publication Data
US 2022/0406848 A1 Dec. 22, 2022

(30) Foreign Application Priority Data
Jun. 17, 2021 (KR) .................. 10-2021-0078919

(51) Int. Cl.
*G11C 13/00* (2006.01)
*H10K 10/50* (2023.01)
(Continued)

(52) U.S. Cl.
CPC ....... *H10K 19/202* (2023.02); *G11C 13/0014* (2013.01); *G11C 13/0069* (2013.01); *H10K 10/50* (2023.02); *H10K 85/221* (2023.02)

(58) Field of Classification Search
CPC .... H10K 19/202; H10K 10/50; H10K 85/221; G11C 13/0014; G11C 13/0069;
(Continued)

(56) References Cited

U.S. PATENT DOCUMENTS 8,014,188 B2  9/2011  Oyasato et al.
9,245,629 B2  1/2016  Samachisa et al.
(Continued)

FOREIGN PATENT DOCUMENTS

| | | |
|---|---|---|
| CN | 1466218 A | 1/2004 |
| JP | 5119436 B2 | 1/2013 |
| TW | 200826102 A | 6/2008 |

OTHER PUBLICATIONS

Taiwaneese Office Action dated Apr. 19, 2023 for corresponding TW Patent Application No. 111122402.

*Primary Examiner* — Hoai V Ho
(74) *Attorney, Agent, or Firm* — Harness, Dickey & Pierce, P.L.C.

(57) ABSTRACT

A semiconductor memory device includes a plurality of semiconductor patterns extending in a first horizontal direction and separated from each other in a second horizontal direction and a vertical direction, each semiconductor pattern including a first source/drain area, a channel area, and a second source/drain area arranged in the first horizontal direction; a plurality of gate insulating layers covering upper surfaces or side surfaces of the channel areas; a plurality of word lines on the upper surfaces or the side surfaces of the channel areas; and a plurality of resistive switch units respectively connected to first sidewalls of the semiconductor patterns, extending in the first horizontal direction, and separated from each other in the second horizontal direction and the vertical direction, each resistive switch unit including a first electrode, a second electrode, and a resistive switch material layer between the first and second electrodes and including carbon nanotubes.

20 Claims, 14 Drawing Sheets

(51) Int. Cl.
  *H10K 19/00* (2023.01)
  *H10K 85/20* (2023.01)
(58) Field of Classification Search
  CPC . G11C 2213/82; G11C 13/003; G11C 13/025;
    G11C 2013/0092; G11C 2213/79; G11C
    13/0009; G11C 13/0097; H10B 63/84;
    H10N 70/823; H10N 70/8845
  USPC .................................................. 365/185.25
  See application file for complete search history.

(56)  References Cited

U.S. PATENT DOCUMENTS

| | | |
|---|---|---|
| 9,390,790 B2 | 7/2016 | Bertin et al. |
| 10,910,378 B2 | 2/2021 | Lee et al. |
| 2014/0179068 A1 | 6/2014 | Samachisa et al. |
| 2016/0027488 A1 | 1/2016 | Kim |
| 2016/0315122 A1 | 10/2016 | Bertin et al. |
| 2018/0122825 A1 | 5/2018 | Lupino et al. |
| 2021/0050369 A1 | 2/2021 | Or-Bach et al. |
| 2021/0104527 A1* | 4/2021 | Son .................. H10B 12/30 |
| 2022/0392957 A1* | 12/2022 | Gomes ............... H10B 63/30 |
| 2023/0065850 A1* | 3/2023 | Lee .................... H10N 50/80 |
| 2023/0089791 A1* | 3/2023 | Cheng .............. G11C 13/0069 257/4 |

* cited by examiner

A1-A1'

A2-A2'

SEMICONDUCTOR MEMORY DEVICE

CROSS-REFERENCE TO RELATED APPLICATION

This application is based on and claims priority under 35 U.S.C. § 119 to Korean Patent Application No. 10-2021-0078919, filed on Jun. 17, 2021, in the Korean Intellectual Property Office, the disclosure of which is incorporated by reference herein in its entirety.

BACKGROUND

The inventive concepts relate to semiconductor memory devices, and particularly, to three-dimensional semiconductor memory devices.

The demand for the miniaturization, multi-function, and high-performance of electronic products causes the demand for high-capacity semiconductor memory devices, and to provide the high-capacity semiconductor memory devices, an increased degree of integration is demanded. Because a degree of integration of existing two-dimensional semiconductor memory devices is mainly determined by an area of a unit memory cell, the degree of integration of two-dimensional semiconductor memory devices has been increasing but is still limited. Accordingly, a three-dimensional semiconductor memory device has been proposed to increase a memory capacity by stacking a plurality of memory cells on a substrate in a vertical direction.

SUMMARY

The inventive concepts provide three-dimensional semiconductor memory devices having an improved degree of integration.

According to an example embodiment of the inventive concepts, there is provided a semiconductor memory device including: a plurality of semiconductor patterns extending, above a substrate, in a first horizontal direction and separated from each other in a second horizontal direction and a vertical direction, each semiconductor pattern including a first source/drain area, a channel area, and a second source/drain area arranged in the first horizontal direction; a plurality of gate insulating layers covering upper surfaces or side surfaces of the channel areas of the plurality of semiconductor patterns; a plurality of word lines on the upper surfaces or the side surfaces of the channel areas of the plurality of semiconductor patterns; and a plurality of resistive switch units respectively connected to first sidewalls of the plurality of semiconductor patterns, extending in the first horizontal direction, and separated from each other in the second horizontal direction and the vertical direction, each resistive switch unit including a first electrode, a second electrode, and a resistive switch material layer between the first electrode and the second electrode and including carbon nanotubes.

According to another example embodiment of the inventive concepts, there is provided a semiconductor memory device including: a plurality of semiconductor patterns extending, above a substrate, in a first horizontal direction and separated from each other in a second horizontal direction and a vertical direction, each semiconductor pattern including a first source/drain area, a channel area, and a second source/drain area arranged in the first horizontal direction; a plurality of gate insulating layers covering upper surfaces or side surfaces of the channel areas of the plurality of semiconductor patterns; a plurality of word lines on the upper surfaces or the side surfaces of the channel areas of the plurality of semiconductor patterns; and a plurality of resistive switch units respectively connected to first sidewalls of the plurality of semiconductor patterns, extending in the first horizontal direction, and separated from each other in the second horizontal direction and the vertical direction, each resistive switch unit including a first electrode, a second electrode, and a resistive switch material layer between the first electrode and the second electrode, wherein the resistive switch material layer includes a carbon nanotube bundle and is configured to transit from a high resistance state to a low resistance state when a set voltage is applied to the plurality of resistive switch units.

According to another example embodiment of the inventive concepts, there is provided a semiconductor memory device including: a plurality of semiconductor patterns extending, above a substrate, in a first horizontal direction and separated from each other in a second horizontal direction and a vertical direction, each semiconductor pattern including a first source/drain area, a channel area, and a second source/drain area arranged in the first horizontal direction; a plurality of gate insulating layers covering lower surfaces and upper surfaces of the channel areas of the plurality of semiconductor patterns; a plurality of word lines on the lower surfaces and the upper surfaces of the channel areas of the plurality of semiconductor patterns, extending in the second horizontal direction, and extending in the vertical direction; a plurality of resistive switch units respectively connected to first sidewalls of the plurality of semiconductor patterns, extending in the first horizontal direction, and separated from each other in the second horizontal direction and the vertical direction, each resistive switch unit including a first electrode, a second electrode, and a resistive switch material layer between the first electrode and the second electrode; and a plurality of bit lines connected to second sidewalls of the plurality of semiconductor patterns, extending in the vertical direction, and separated from each other in the second horizontal direction, wherein the resistive switch material layer includes a carbon nanotube bundle.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, example embodiments of the inventive concepts will be described in detail with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
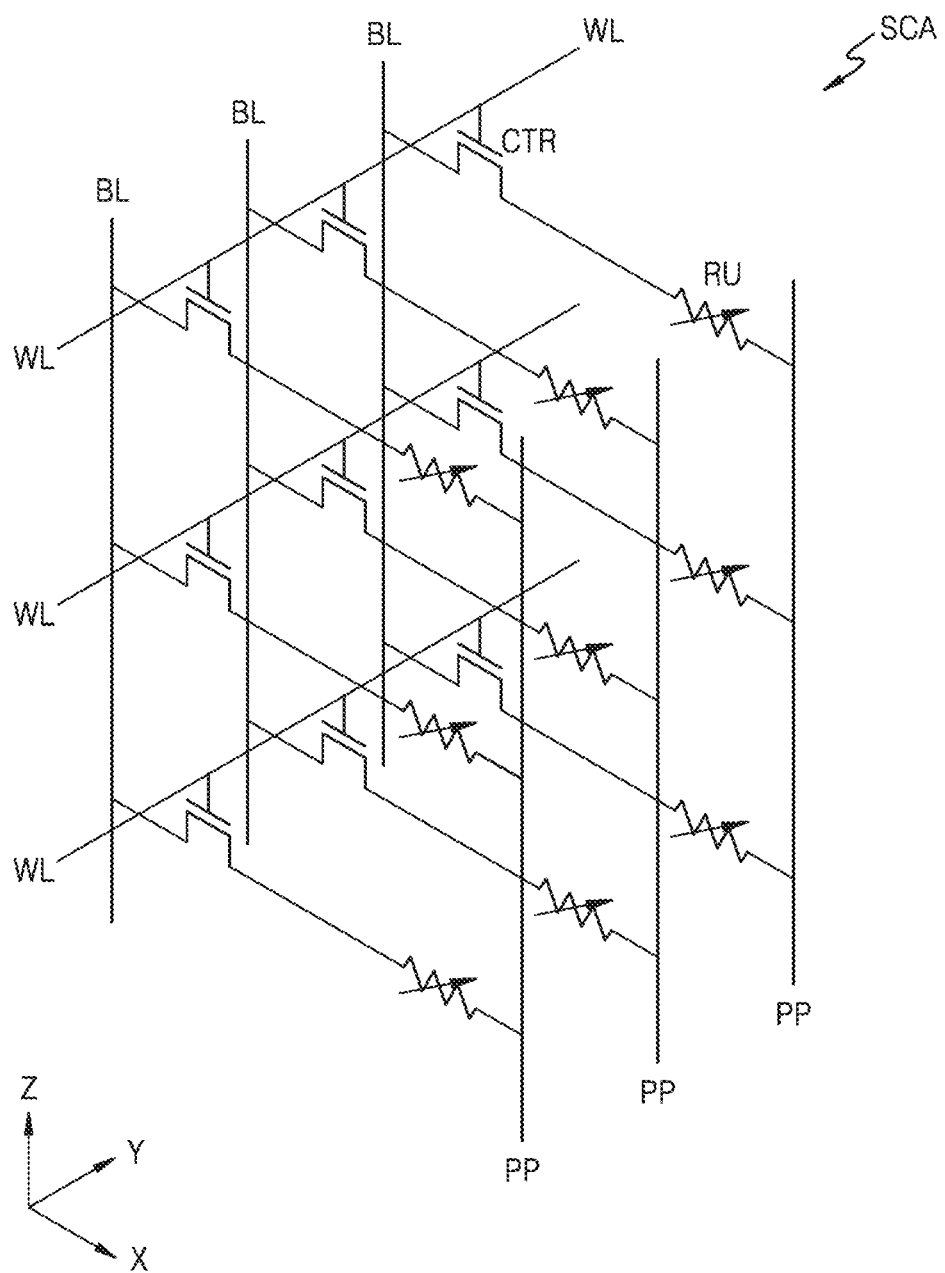
FIG. 1 is an equivalent circuit diagram of a cell array in a semiconductor memory device according to example embodiments.

FIG. 1 is an equivalent circuit diagram of a cell array in a semiconductor memory device according to example embodiments.

Referring to FIG. 1, the cell array in the semiconductor memory device may include a plurality of sub-cell arrays SCA. A sub-cell array SCA may include a plurality of bit lines BL, a plurality of word lines WL, a plurality of cell transistors CTR, and a plurality of resistive switch units RU. One cell transistor CTR may be between one word line WL and one bit line BL, and one resistive switch unit RU may be connected to one cell transistor CTR.

The plurality of bit lines BL may be conductive patterns (e.g., metal lines) separated from a substrate and extending in a vertical direction Z. The plurality of bit lines BL may be separated from each other in a second horizontal direction Y and extend in the vertical direction Z.

A word line WL may be a conductive pattern (e.g., a metal line) separated from the substrate. Word lines WL in one sub-cell array SCA may extend in the second horizontal direction Y and be separated from each other in the vertical direction Z.

A gate of a cell transistor CTR may be connected to a word line WL, and a source of the cell transistor CTR may be connected to a bit line BL. The cell transistor CTR may be separated from the word line WL in the first horizontal direction X. A drain of the cell transistor CTR may be connected to a first terminal of a resistive switch unit RU. A second terminal of the resistive switch unit RU may be connected to a ground wiring PP.

The resistive switch unit RU may include a variable resistive material of which a resistance value varies according to a magnitude of a voltage applied to both ends of the resistive switch unit RU, for example, include a variable resistive material in which a Mott transition occurs from the high resistance state to the low resistance state.

Figure 2:
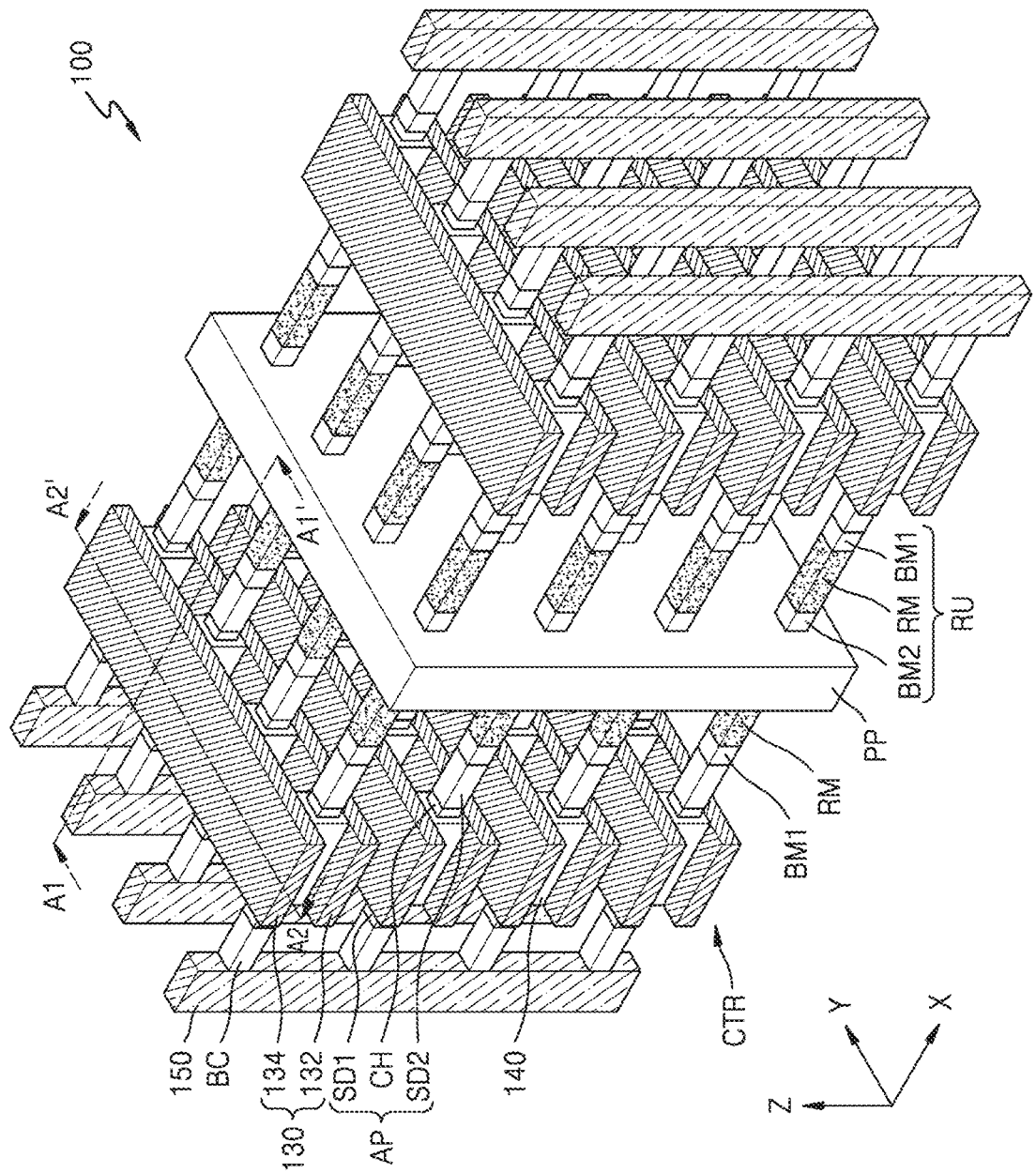
FIG. 2 is a perspective view of a semiconductor memory device according to example embodiments.
Figure 3:
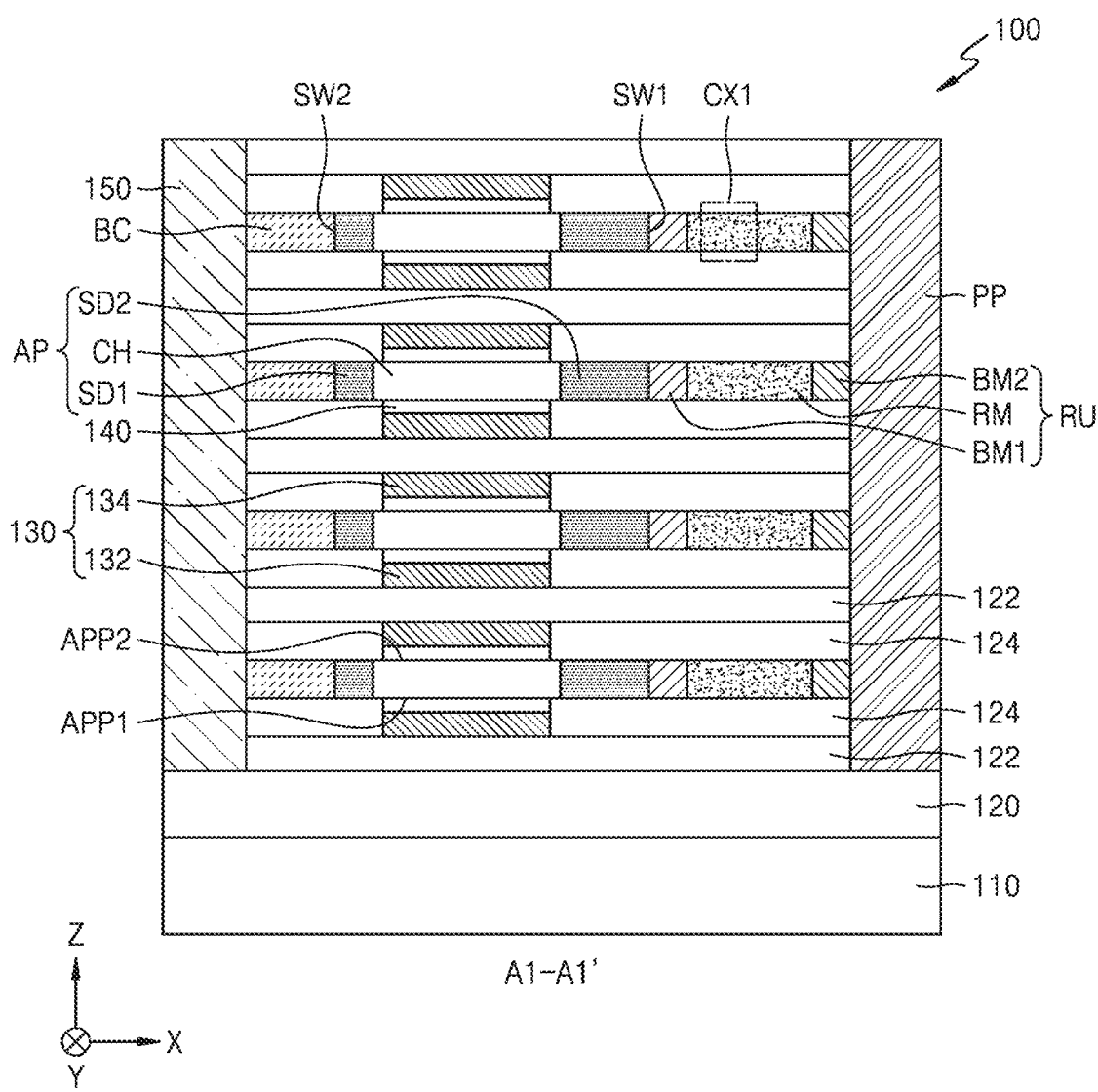
FIG. 3 is a cross-sectional view taken along line A1-A1' of FIG. 2.
Figure 4:
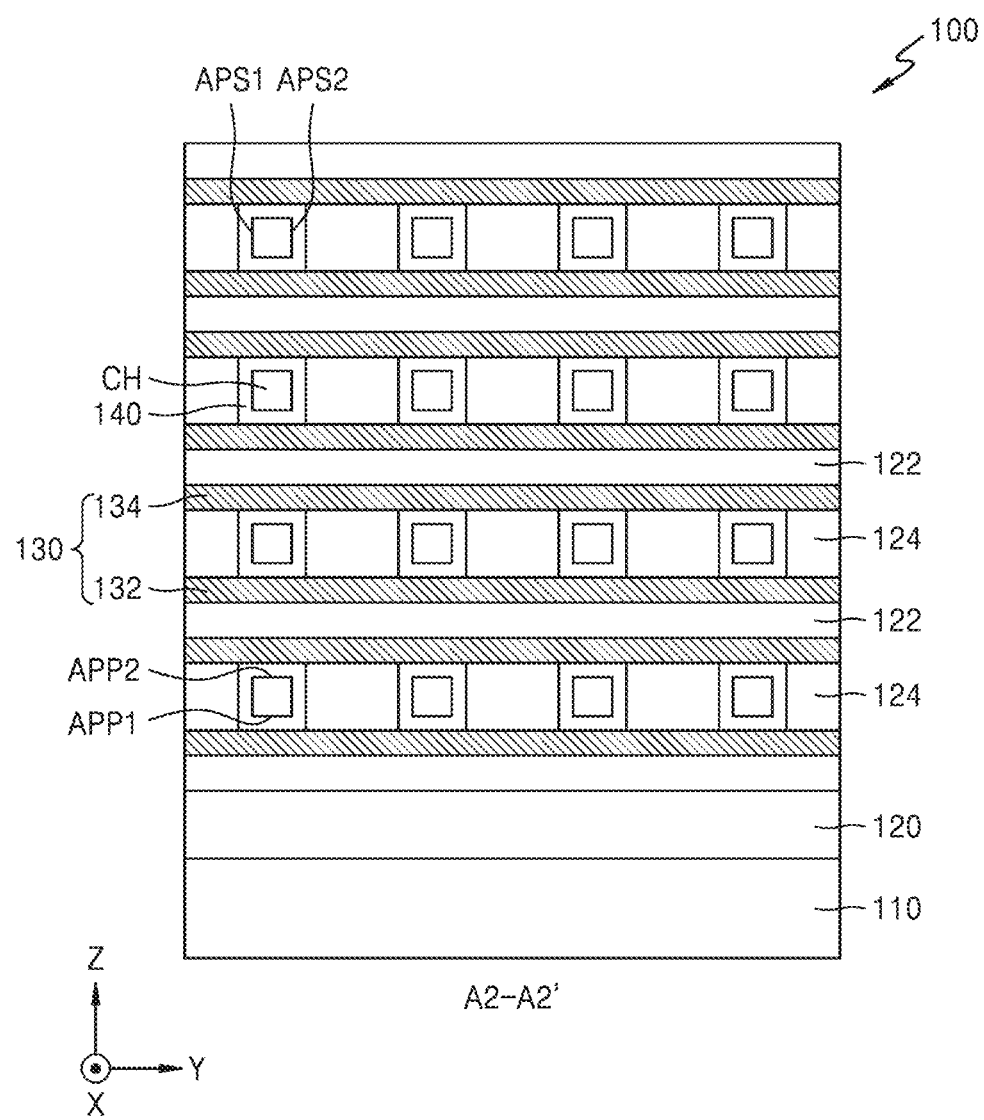
FIG. 4 is a cross-sectional view taken along line A2-A2' of FIG. 2.
Figure 5:
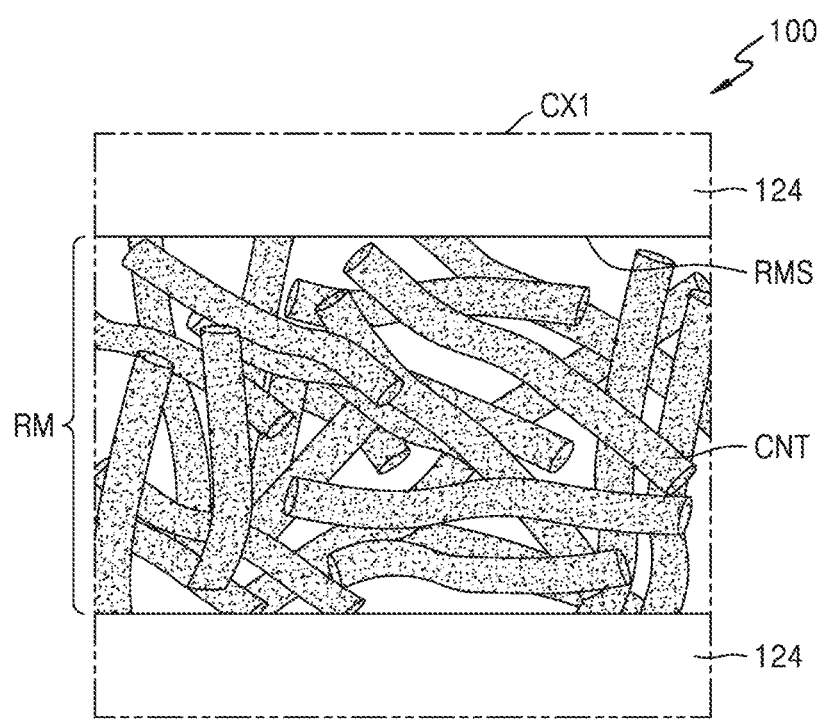
FIG. 5 is a magnified view of a portion CX1 of FIG. 3.

FIG. 2 is a perspective view of a semiconductor memory device 100 according to example embodiments. FIG. 3 is a cross-sectional view taken along line A1-A1' of FIG. 2, and FIG. 4 is a cross-sectional view taken along line A2-A2' of FIG. 2. FIG. 5 is a magnified view of a region CX1 of FIG. 3. In FIG. 2, a first mold insulating layer 122 and a second mold insulating layer 124 are omitted.

Referring to FIGS. 2 to 5, the semiconductor memory device 100 may include a plurality of semiconductor patterns AP, a plurality of bit lines 150, a plurality of word lines 130, and a plurality of resistive switch units RU above a substrate 110.

The substrate 110 may include silicon (Si), germanium (Ge), SiGe, or the like. Alternatively, for example, the substrate 110 may include a silicon-on-insulator (SOI) substrate or a germanium-on-insulator (GeOI) substrate.

Although not shown, a peripheral circuit (not shown) and a wiring layer (not shown) connected to the peripheral circuit may be further formed on a partial region of the substrate 110. For example, the peripheral circuit may include a planar metal-oxide-semiconductor field-effect transistor (MOSFET) constituting a sub-word line driver, a sense amplifier, and the like but is not limited thereto.

A lower insulating layer 120 may be on the substrate 110, and the lower insulating layer 120 may be arranged to cover the peripheral circuit and the wiring layer formed on the substrate 110.

Above the substrate 110, the plurality of semiconductor patterns AP may extend in a first horizontal direction X and be separated from each other in the vertical direction Z. The plurality of semiconductor patterns AP may include, for example, an intrinsic semiconductor material or a doped semiconductor material. In some example embodiments, the plurality of semiconductor patterns AP may include polysilicon. In some example embodiments, the plurality of semiconductor patterns AP may include an amorphous metal oxide, a polycrystalline metal oxide, a combination of the amorphous metal oxide and the polycrystalline metal oxide, or the like, for example, include at least one of an indium (In)-gallium (Ga) oxide (IGO), an In-zinc (Zn) oxide (IZO), and an In—Ga—Zn oxide (IGZO).

The plurality of semiconductor patterns AP may have a line or bar shape extending in the first horizontal direction X. Each semiconductor pattern AP may include a channel area CH, and a first source/drain area SD1 and a second source/drain area SD2 arranged in the first horizontal direction X with the channel area CH therebetween. The first source/drain area SD1 may be connected to a bit line 150, and the second source/drain area SD2 may be connected to a resistive switch unit RU. The first source/drain area SD1 and the second source/drain area SD2 may include a semiconductor material doped with a highly concentrated n-type impurity.

Each of a lower surface APP1 and an upper surface APP2 of the channel area CH of the semiconductor pattern AP may have a flat shape extending in the first horizontal direction X. The semiconductor pattern AP may have a first sidewall SW1 and a second sidewall SW2 separated from each other in the first horizontal direction X.

The plurality of word lines 130 may be adjacent to the plurality of semiconductor patterns AP and extend in the second horizontal direction Y. The semiconductor memory device 100 may have a dual-gate transistor structure, and as shown in FIG. 2, each of the plurality of word lines 130 may include a first gate electrode 132 and a second gate electrode 134 respectively above the lower surface APP1 and the upper surface APP2 of the channel area CH of each of the plurality of semiconductor patterns AP. For example, a plurality of first gate electrodes 132 and a plurality of second gate electrodes 134 may be alternately arranged in the vertical direction Z. Each of the first gate electrode 132 and the second gate electrode 134 may have a flat plate shape and be separated from each other.

In some example embodiments, the first gate electrode 132 and the second gate electrode 134 may include at least one of a doped semiconductor material (doped Si, doped Ge, or the like), a conductive metal nitride (a titanium nitride, a tantalum nitride, or the like), a metal (tungsten, titanium, tantalum, or the like), and/or a metal-semiconductor compound (a tungsten silicide, a cobalt silicide, a titanium silicide, or the like).

A gate insulating layer 140 may be between the first gate electrode 132 and the semiconductor pattern AP and between the second gate electrode 134 and the semiconductor pattern AP. For example, as shown in FIGS. 3 and 4, the gate insulating layer 140 may be arranged to surround the lower surface APP1, the upper surface APP2, a first side surface APS1, and a second side surface APS2 of the channel area CH. In some example embodiments, portions of the gate insulating layer 140 covering the lower surface APP1 and the upper surface APP2 of the channel area CH may be in contact with the first gate electrode 132 and the second gate electrode 134, and portions of the gate insulating layer 140 covering the first side surface APS1 and the second side surface APS2 of the channel area CH may not be in contact with the first gate electrode 132 or the second gate electrode 134.

In some example embodiments, unlike shown in FIGS. 3 and 4, the gate insulating layer 140 may cover the lower surface APP1 and the upper surface APP2 of the channel area CH and extend in the second horizontal direction Y, and in some example embodiments, the gate insulating layer 140 may not cover the first side surface APS1 and the second side surface APS2 of the channel area CH.

In some example embodiments, the gate insulating layer 140 may include at least one selected from a high-k dielectric material, having a higher dielectric constant than a silicon oxide, and a ferroelectric material. In some example embodiments, the gate insulating layer 140 may include at least one selected from among a hafnium oxide (HfO), a hafnium silicate (HfSiO), a hafnium oxynitride (HfON), a hafnium silicon oxynitride (HfSiON), a lanthanum oxide (LaO), a lanthanum aluminum oxide (LaAlO), a zirconium oxide (ZrO), a zirconium silicate (ZrSiO), a zirconium oxynitride (ZrON), a zirconium silicon oxynitride (ZrSiON), a tantalum oxide (TaO), a titanium oxide (TiO), a barium strontium titanium oxide (BaSrTiO), a barium titanium oxide (BaTiO), a lead zirconate titanate (PZT), a strontium bismuth tantalate (SBT), a bismuth ferric oxide (BFO), a strontium titanium oxide (SrTiO), an yttrium oxide (YO), an aluminum oxide (AlO), and a lead scandium tantalum oxide (PbScTaO).

A plurality of first mold insulating layers 122 may be arranged above the lower insulating layer 120 to be separated from each other in the vertical direction Z. Each of the plurality of first mold insulating layers 122 may be between two adjacent word lines 130 among the plurality of word lines 130 and be separated from the two adjacent word lines 130 in the first horizontal direction X and the second horizontal direction Y. For example, each of the plurality of first mold insulating layers 122 may be between an upper surface of a second gate electrode 134 of a lower word line 130 of the two adjacent word lines 130 and a lower surface of a first gate electrode 132 of an upper word line 130 thereof.

A plurality of second mold insulating layers 124 may be alternately arranged with the plurality of first mold insulating layers 122 in the vertical direction Z and arranged to cover upper surfaces, lower surfaces, and both side surfaces of the plurality of semiconductor patterns AP. For example, the plurality of second mold insulating layers 124 may be arranged to cover upper surfaces, lower surfaces, and both side surfaces of the first source/drain areas SD1 and the second source/drain areas SD2 and cover the first side surfaces APS1 and the second side surfaces APS2 of the channel areas CH.

The plurality of bit lines 150 may extend in the vertical direction Z above the substrate 110 and be separated from each other in the second horizontal direction Y. The plurality of bit lines 150 may include any one of a doped semiconductor material, a conductive metal nitride, a metal, and a metal-semiconductor compound.

A contact layer BC may be between the plurality of bit lines 150 and the plurality of semiconductor patterns AP. The contact layer BC may be connected to second sidewalls SW2 of the plurality of semiconductor patterns AP. The contact layer BC may include a metal silicide material, for example, include at least one of a titanium silicide, a tungsten silicide, a cobalt silicide, and a nickel silicide.

A resistive switch unit RU may include a first electrode BM1, a resistive switch material layer RM, and a second electrode BM2 sequentially arranged in the first horizontal direction X. The resistive switch unit RU may be connected to the first sidewall SW1 of each of the plurality of semiconductor patterns AP and arranged so that, for example, the first electrode BM1 is connected to the second source/drain area SD2 of the semiconductor pattern AP. Although not shown, an additional contact layer (not shown) may be further formed between the first electrode BM1 and the second source/drain area SD2.

In some example embodiments, the first electrode BM1 and the second electrode BM2 may include a doped semiconductor material, a conductive metal nitride such as a titanium nitride, a tantalum nitride, a niobium nitride, or a tungsten nitride, a metal such as ruthenium, iridium, titanium, or tantalum, or a conductive metal oxide such as an iridium oxide or a niobium oxide.

The resistive switch material layer RM may be between the first electrode BM1 and the second electrode BM2. The resistive switch material layer RM may be configured to reversibly transit from the low resistance state to the high resistance state and from the high resistance state to the low resistance state by a voltage applied to both ends of the resistive switch material layer RM through the first electrode BM1 and the second electrode BM2. For example, the resistive switch material layer RM may be a variable resistance layer in which a Mott transition occurs due to voltage application.

In some example embodiments, the resistive switch material layer RM may include a carbon nanotube bundle CNT. In some example embodiments, the carbon nanotube bundle CNT may include single-wall carbon nanotubes, double-wall carbon nanotubes, multi-wall carbon nanotubes, or a combination thereof.

As shown in FIG. 3, the resistive switch material layer RM may be between two second mold insulating layers 124 adjacent in the vertical direction Z among the plurality of second mold insulating layers 124. For example, as shown in FIG. 3, a switch material layer space RMS may be formed between two second mold insulating layers 124 adjacent in the vertical direction Z among the plurality of second mold insulating layers 124 and filled with the carbon nanotube bundle CNT. In some example embodiments, the carbon nanotube bundle CNT may include carbon nanotubes, each carbon nanotube having a diameter of about 1 nm to about 10 nm and a length of several nm (e.g., 1 nm, 2 nm, 3 nm, 4 nm, 5 nm, 6 nm, or 7 nm) to about 50 nm. For example, the carbon nanotube bundle CNT may indicate a three-dimensional network of a plurality of carbon nanotubes randomly arranged.

The carbon nanotube bundle CNT may transit from a first arrangement state AS1 (see FIG. 6) having a relatively large first resistance R1 to a second arrangement state AS2 (see FIG. 6) having a relatively small second resistance R2, and this resistance change characteristic due to voltage application may be referred to as a Mott transition characteristic. For example, in a set operation, the carbon nanotubes in the carbon nanotube bundle CNT may have a mutually close contact state according to attraction by a Van der Waals force, and in a reset operation, at least some carbon nanotubes in the carbon nanotube bundle CNT may have a non-contact state in which the at least some carbon nanotubes are away from each other according to repulsion by phonon excitation.

In some example embodiments, the carbon nanotube bundle CNT may relatively loosely fill the inside of the switch material layer space RMS in a state in which at least some carbon nanotubes in the carbon nanotube bundle CNT are not in contact with each other. That is, at least some carbon nanotubes in the carbon nanotube bundle CNT may be isolated from other carbon nanotubes. This arrangement of the carbon nanotube bundle CNT may be referred to as the first arrangement state AS1. For example, the first arrangement state AS1 may indicate a state in which at least some carbon nanotubes in the carbon nanotube bundle CNT are not in contact with the other carbon nanotubes. In the first arrangement state AS1, an average separation distance between the carbon nanotubes may be relatively large. In the first arrangement state AS1, an average density of the carbon nanotube bundle CNT may be relatively small, and a volume of the carbon nanotube bundle CNT may be relatively large.

The carbon nanotube bundle CNT may transit from the first arrangement state AS1 to the second arrangement state AS2 according to a voltage applied to the carbon nanotube bundle CNT. The second arrangement state AS2 may be a state in which the carbon nanotubes in the carbon nanotube bundle CNT are in close contact with each other. For example, in the second arrangement state AS2, mutual attraction may be exhibited by the carbon nanotubes by a Van der Waals force, and accordingly, the carbon nanotube bundle CNT may be arranged to be densely concentrated with a relatively small volume.

Figure 6:
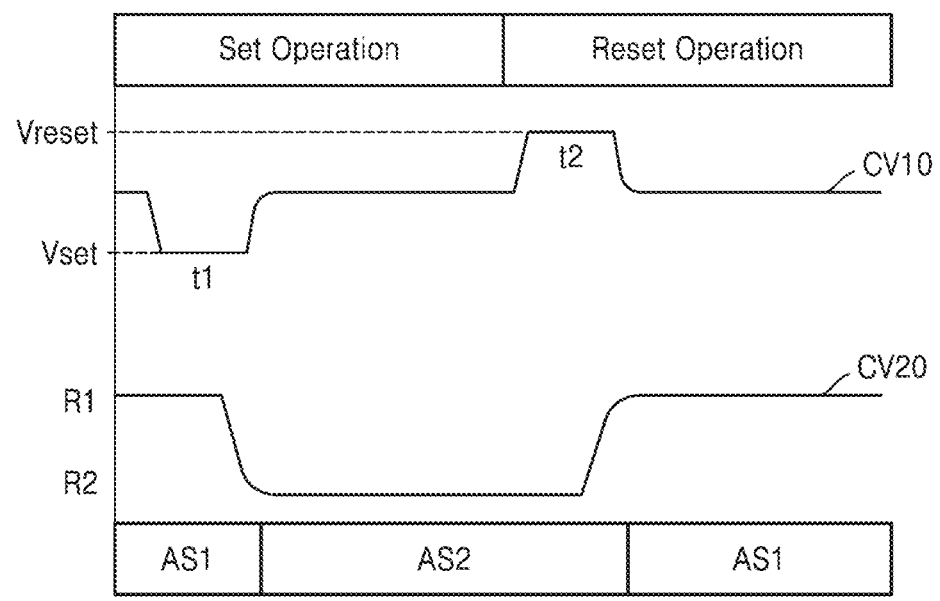
FIG. 6 illustrates a method of operating a semiconductor memory device, according to example embodiments.
Figure 6:
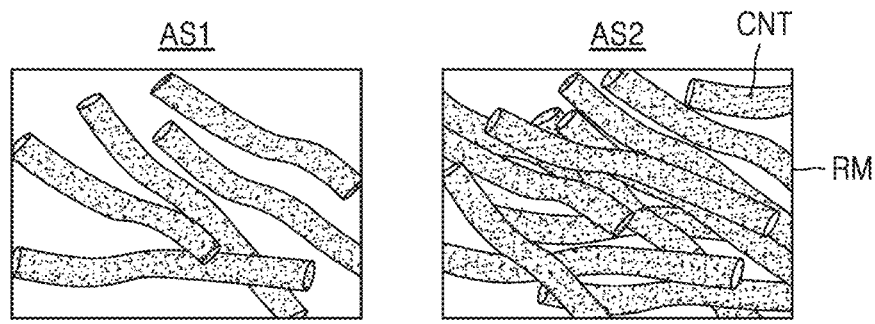

In some example embodiments, when the carbon nanotube bundle CNT is in the first arrangement state AS1, the resistive switch material layer RM may have the first resistance R1 (see FIG. 6). When the carbon nanotube bundle CNT is in the second arrangement state AS2, the resistive switch material layer RM may have the second resistance R2 (see FIG. 6), wherein the second resistance R2 may be less than the first resistance R1. For example, the first resistance R1 may be 10 times or more the second resistance R2 but is not limited thereto.

The ground wiring PP may be arranged at one end of a resistive switch unit RU. The ground wiring PP may extend in the vertical direction Z and the second horizontal direction Y.

FIG. 2 shows an example in which, with reference to the ground wiring PP, one sub-cell array SCA is arranged to the left of the ground wiring PP, and another sub-cell array SCA is arranged to the right of the ground wiring PP in a mirror-symmetry structure with the one sub-cell array SCA. However, an arrangement of sub-cell arrays SCA is not limited thereto. In addition, although FIG. 2 shows an example in which one sub-cell array SCA includes four resistive switch units RU in the vertical direction Z, the number of resistive switch units RU arranged in the vertical direction Z may vary to be 8, 16, 24, 32, 64, 72, 96, 128, 160, or the like.

In addition, FIG. 2 shows an example in which a height of one resistive switch unit RU in the vertical direction Z is the same as a height of one semiconductor pattern AP in the vertical direction Z, and a width of one resistive switch unit RU in the second horizontal direction Y is the same as a width of one semiconductor pattern AP in the second horizontal direction Y. However, in some example embodiments, the height of one resistive switch unit RU in the vertical direction Z may be greater than the height of one semiconductor pattern AP in the vertical direction Z, or the width of one resistive switch unit RU in the second horizontal direction Y may be greater than the width of one semiconductor pattern AP in the second horizontal direction Y.

In general, a dynamic random access memory (DRAM) device has a structure in which one cell transistor and one capacitor constitute one memory cell. Along with an increase in a degree of integration of a DRAM device, a degree of difficulty of a process of forming a capacitor having an increased surface area has remarkably increased, and significantly large power consumption has been required for a refresh operation of the capacitor.

However, according to the example embodiments described above, the semiconductor memory device 100 is a three-dimensional semiconductor memory device in which a plurality of memory cells, each including a cell transistor CTR and a resistive switch unit RU, are stacked in the vertical direction Z, and thus, the semiconductor memory device 100 may have a large memory capacity. In addition, a refresh operation is unnecessary to drive a resistive switch unit RU, and thus, the semiconductor memory device 100 may perform a low power operation. In addition, the carbon nanotube bundle CNT included in the resistive switch material layer RM has a high elastic modulus, and thus, when the semiconductor memory device 100 is used as an electronic-mechanical switch, the semiconductor memory device 100 may have remarkably improved durability. In addition, the semiconductor memory device 100 may have an increased on-current by the high electron mobility of the carbon nanotube bundle CNT. Therefore, the semiconductor memory device 100 may have a large memory capacity and excellent operating characteristics.

FIG. 6 illustrates a method of operating a semiconductor memory device, according to example embodiments; FIG. 6 shows a voltage curve CV10 and a resistance curve CV20 in a set operation and a reset operation of the semiconductor memory device 100 described with reference to FIGS. 1 to 5.

Referring to FIG. 6, in an initial stage, the carbon nanotube bundle CNT is in the first arrangement state AS1, and in some example embodiments, the resistive switch material layer RM may have the first resistance R1.

In the set operation, a set voltage Vset may be applied to both ends of the resistive switch material layer RM for a first period of time t1, and accordingly, the carbon nanotube bundle CNT may transit from the first arrangement state AS1 to the second arrangement state AS2.

The second arrangement state AS2 may be a state in which carbon nanotubes in the carbon nanotube bundle CNT may be in close contact with each other. For example, in the second arrangement state AS2, mutual attraction may be exhibited by the carbon nanotubes by a Van der Waals force, and accordingly, the carbon nanotube bundle CNT may be arranged to be densely concentrated with a relatively small volume. By applying the set voltage Vset, the carbon nanotube bundle CNT may transit from the first arrangement state AS1 to the second arrangement state AS2, and thus, the resistive switch material layer RM may transit from the first resistance R1, which is relatively large, to the second resistance R2, which is relatively small.

That is, when the set voltage Vset is applied, the resistive switch material layer RM may have the second resistance R2, and in some example embodiments, it is indicated that the resistive switch material layer RM is in an on state, and data recorded on the resistive switch material layer RM may be read as "1".

In the reset operation, a reset voltage Vreset may be applied to both ends of the resistive switch material layer RM for a second period of time t2, and accordingly, the carbon nanotube bundle CNT may transit from the second arrangement state AS2 to the first arrangement state AS1.

The first arrangement state AS1 may be a state in which at least some carbon nanotubes in the carbon nanotube bundle CNT are arranged to be away from each other according to applying repulsion by phonon excitation to the carbon nanotube bundle CNT. By applying the reset voltage Vreset, the carbon nanotube bundle CNT may transit from the second arrangement state AS2 to the first arrangement state AS1, and thus, the resistive switch material layer RM may transit from the second resistance R2, which is relatively small, to the first resistance R1, which is relatively large.

That is, when the reset voltage Vreset is applied, the resistive switch material layer RM may have the first resistance R1, and in some example embodiments, it is indicated that the resistive switch material layer RM is in an off state, and data recorded on the resistive switch material layer RM may be read as "0".

In some example embodiments, the set voltage Vset may be less than −0.6 V. For example, the set voltage Vset may be a negative voltage, and a magnitude of the set voltage Vset may be greater than 0.6 V. For example, the set voltage Vset may include −0.8 V, −1.0 V, −1.2 V, or the like but is not limited thereto. In some example embodiments, the reset voltage Vreset may be greater than 0.6 V. For example, the reset voltage Vreset may be a positive voltage, and a magnitude of the reset voltage Vreset may be greater than 0.6 V. For example, the reset voltage Vreset may include 0.8 V, 1.0 V, 1.2 V, or the like but is not limited thereto. In some example embodiments, the magnitude of the set voltage Vset may be the same as the magnitude of the reset voltage Vreset but is not limited thereto.

Figure 7:
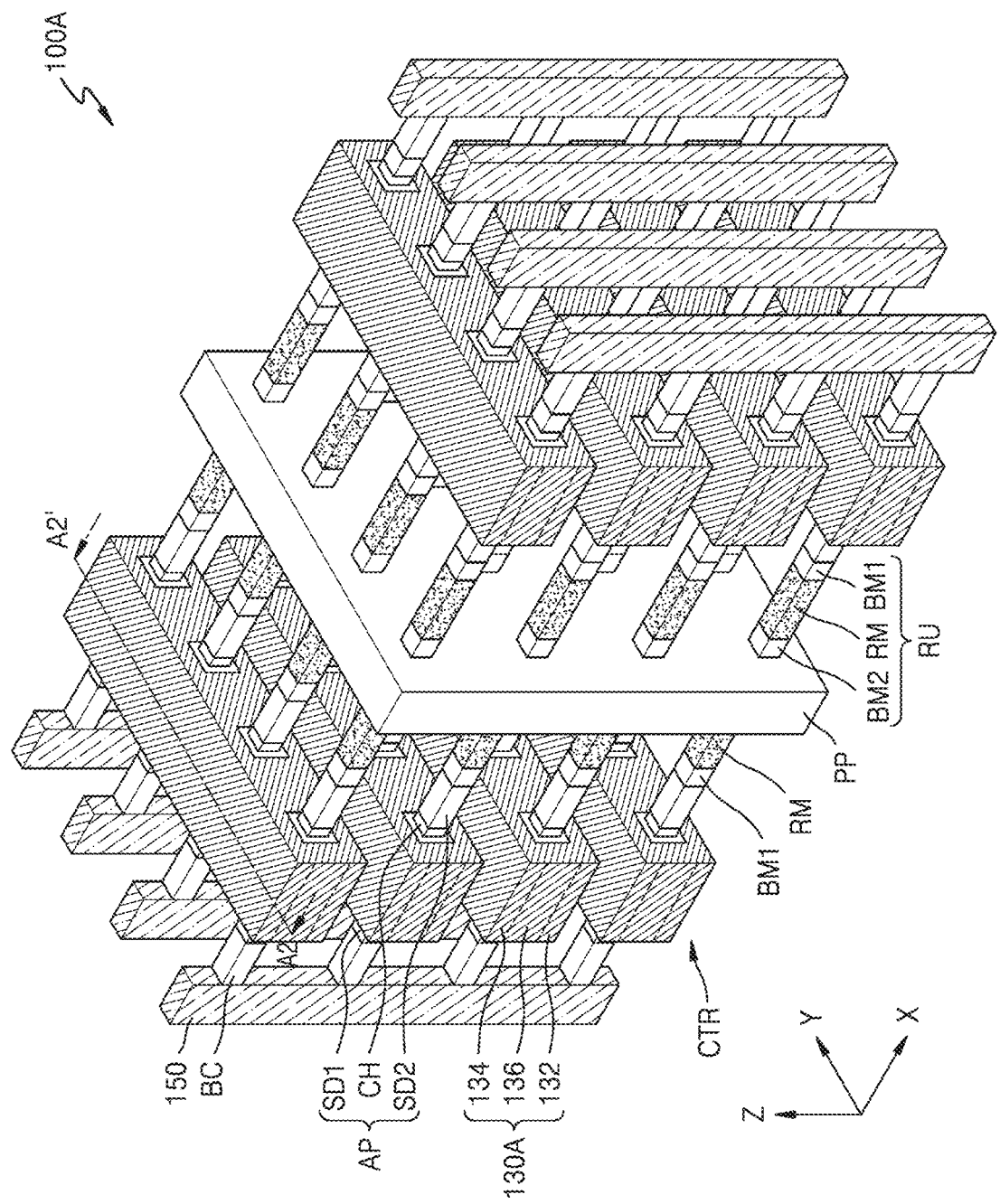
FIG. 7 is a perspective view of a semiconductor memory device according to example embodiments.
Figure 8:
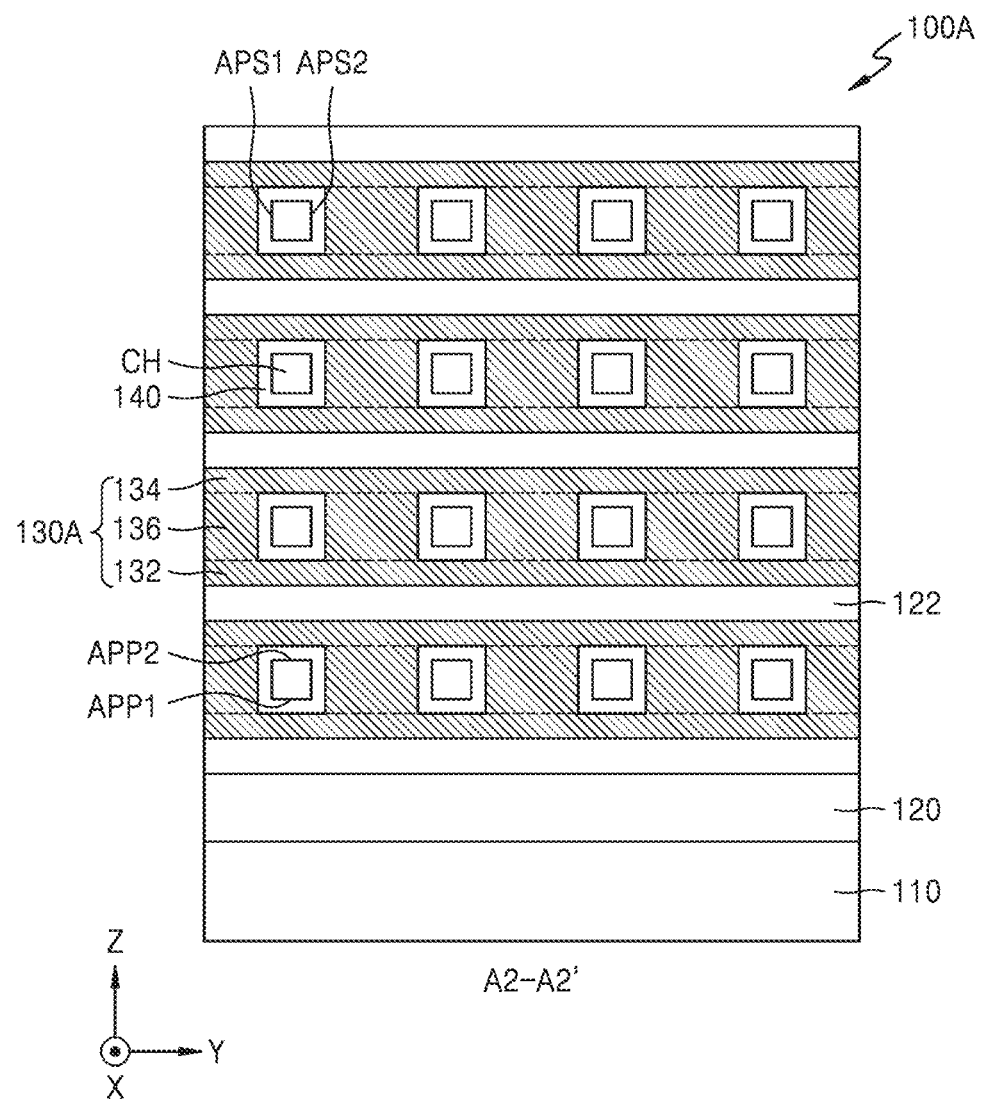
FIG. 8 is a cross-sectional view taken along line A2-A2' of FIG. 7.

FIG. 7 is a perspective view of a semiconductor memory device 100A according to example embodiments. FIG. 8 is a cross-sectional view taken along line A2-A2' of FIG. 7. In FIGS. 7 and 8, like reference numerals in FIGS. 1 to 6 denote like elements.

Referring to FIGS. 7 and 8, each of a plurality of word lines 130A may extend in the second horizontal direction Y and include the first gate electrode 132, the second gate electrode 134, and a connection part 136. The connection part 136 may be arranged to cover the first side surface APS1 and the second side surface APS2 of the channel area CH. The connection part 136 may be between the first gate electrode 132 and the second gate electrode 134 and connect the first gate electrode 132 to the second gate electrode 134. Because the plurality of word lines 130A are arranged to surround all of the lower surface APP1, the upper surface APP2, the first side surface APS1, and the second side surface APS2 of the channel area CH, a cell transistor CTR may be referred to as a gate all around-type transistor.

Figure 9:
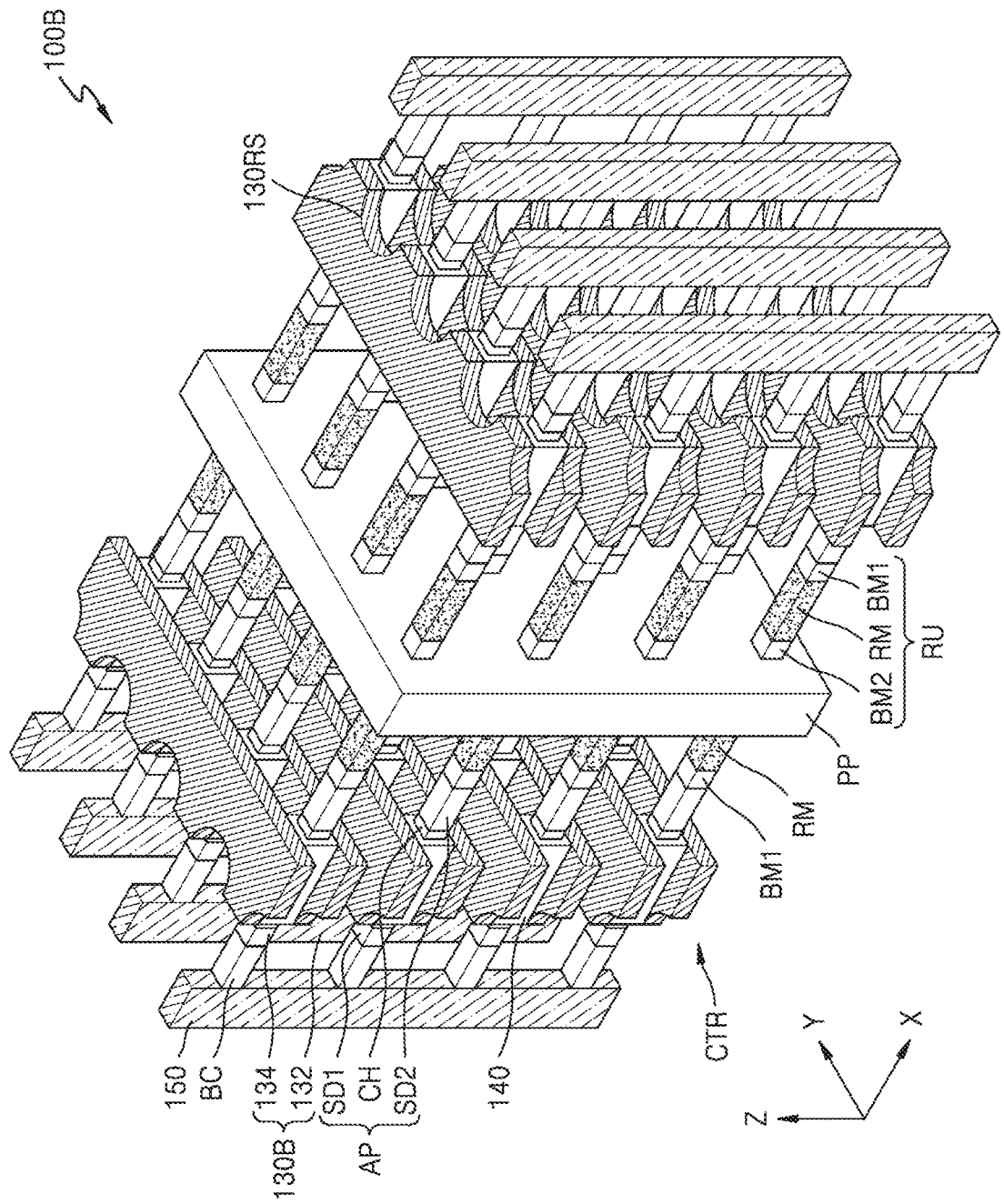
FIG. 9 is a perspective view of a semiconductor memory device according to example embodiments.

FIG. 9 is a perspective view of a semiconductor memory device 100B according to example embodiments. In FIG. 9, like reference numerals in FIGS. 1 to 8 denote like elements.

Referring to FIG. 9, a plurality of word lines 130B may include the first gate electrode 132 and the second gate electrode 134 extending in the second horizontal direction Y. Each of the first gate electrode 132 and the second gate electrode 134 may include a curved sidewall 130RS toward the bit line 150 and have a flat plate shape. The first gate electrode 132 and the second gate electrode 134 may be separated from each other in the vertical direction Z.

In some example embodiments, the curved sidewall 130RS may vertically overlap a space between two adjacent semiconductor patterns AP among the plurality of semiconductor patterns AP, and for example, curved sidewalls 130RS may be arranged at locations offset in the second horizontal direction Y from the plurality of semiconductor patterns AP.

FIG. 9 shows that the plurality of semiconductor patterns AP have a bar shape extending in the first horizontal direction X, and the gate insulating layer 140 is arranged to surround the lower surface APP1 (see FIG. 4), the upper surface APP2 (see FIG. 4), the first side surface APS1 (see FIG. 4), and the second side surface APS2 (see FIG. 4) of the channel area CH of each of the plurality of semiconductor patterns AP. However, unlike shown in FIG. 9, the gate insulating layer 140 may be arranged to cover only the lower surface APP1 and the upper surface APP2 of the channel area CH of each of the plurality of semiconductor patterns AP and to have the same horizontal cross-sectional shape as the first gate electrode 132 and the second gate electrode 134 by extending in the second horizontal direction Y. In addition, in some example embodiments, at least a portion of the channel area CH or the second source/drain area SD2 of each of the plurality of semiconductor patterns AP may include a protruding portion having a width increased in the second horizontal direction Y.

Figure 10:
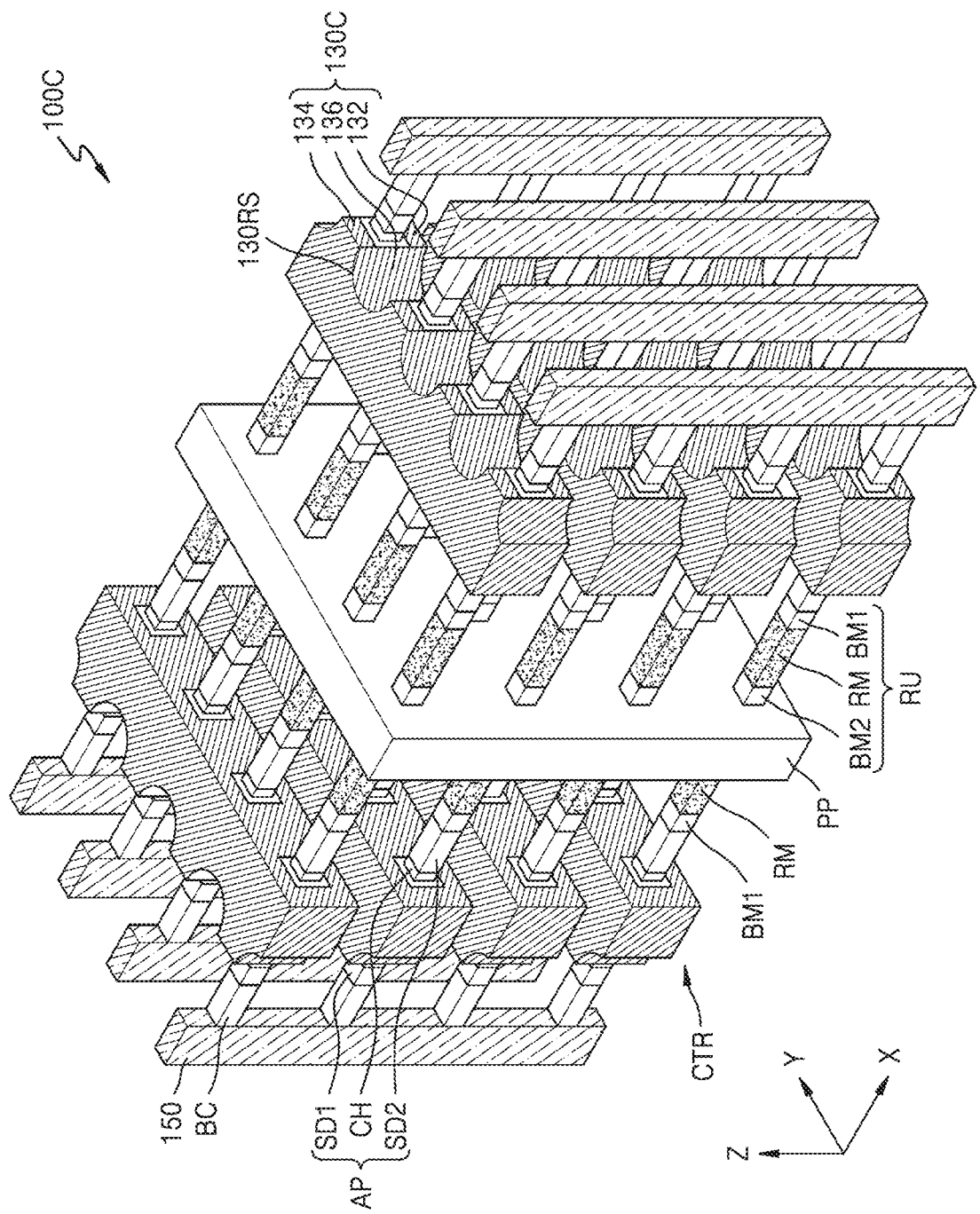
FIG. 10 is a perspective view of a semiconductor memory device according to example embodiments.

FIG. 10 is a perspective view of a semiconductor memory device 100C according to example embodiments. In FIG. 10, like reference numerals in FIGS. 1 to 9 denote like elements.

Referring to FIG. 10, a plurality of word lines 130C may include the first gate electrode 132, the second gate electrode 134, and the connection part 136. The connection part 136 may be arranged to cover the first side surface APS1 and the second side surface APS2 of the channel area CH. The connection part 136 may be between the first gate electrode 132 and the second gate electrode 134 and connect the first gate electrode 132 to the second gate electrode 134. A cell transistor CTR may be referred to as a gate all around-type transistor.

The first gate electrode 132, the second gate electrode 134, and the connection part 136 may include the curved sidewall 130RS toward the bit line 150. In some example embodiments, the curved sidewall 130RS may vertically overlap a space between two adjacent semiconductor patterns AP among the plurality of semiconductor patterns AP, and for example, curved sidewalls 130RS may be arranged at locations offset in the second horizontal direction Y from the plurality of semiconductor patterns AP.

FIG. 10 shows that the plurality of semiconductor patterns AP have a bar shape having a constant width in the second horizontal direction Y and extending in the first horizontal direction X. However, unlike shown in FIG. 10, at least a portion of the channel area CH or the second source/drain area SD2 of each of the plurality of semiconductor patterns AP may include a protruding portion having a width increased in the second horizontal direction Y.

Figure 11:
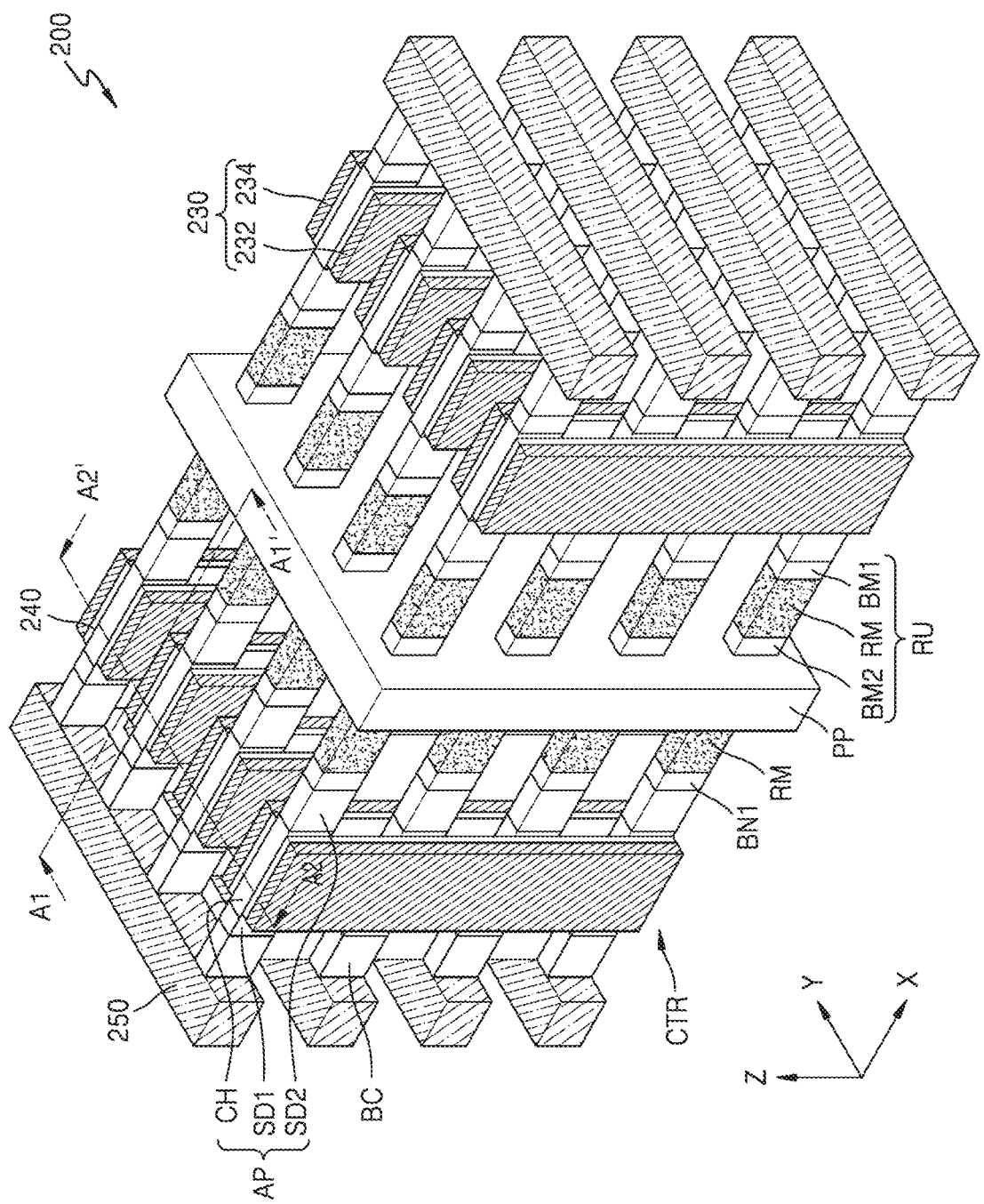
FIG. 11 is a perspective view of a semiconductor memory device according to example embodiments.
Figure 12:
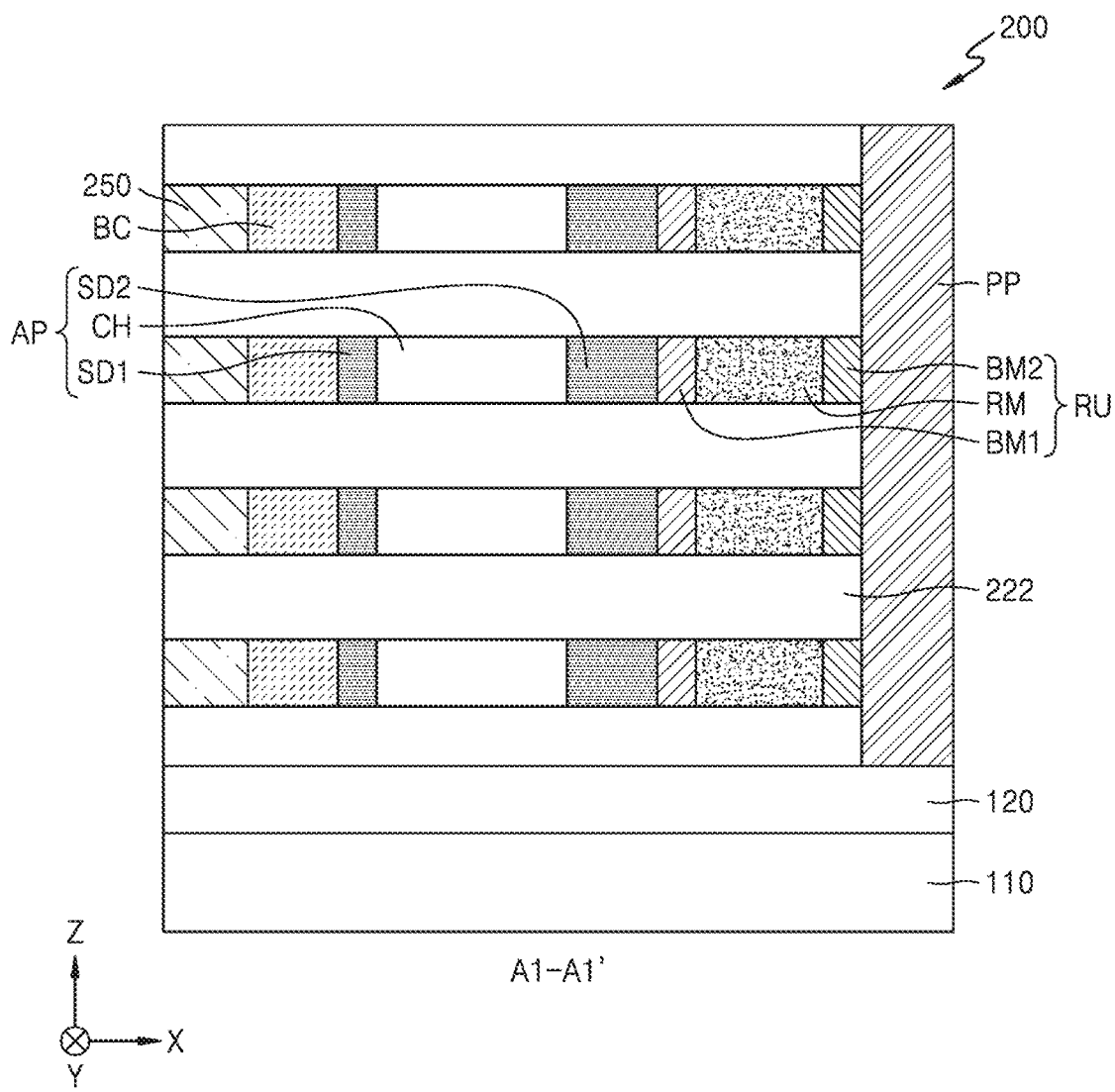
FIG. 12 is a cross-sectional view taken along line A1-A1' of FIG. 11.
Figure 13:
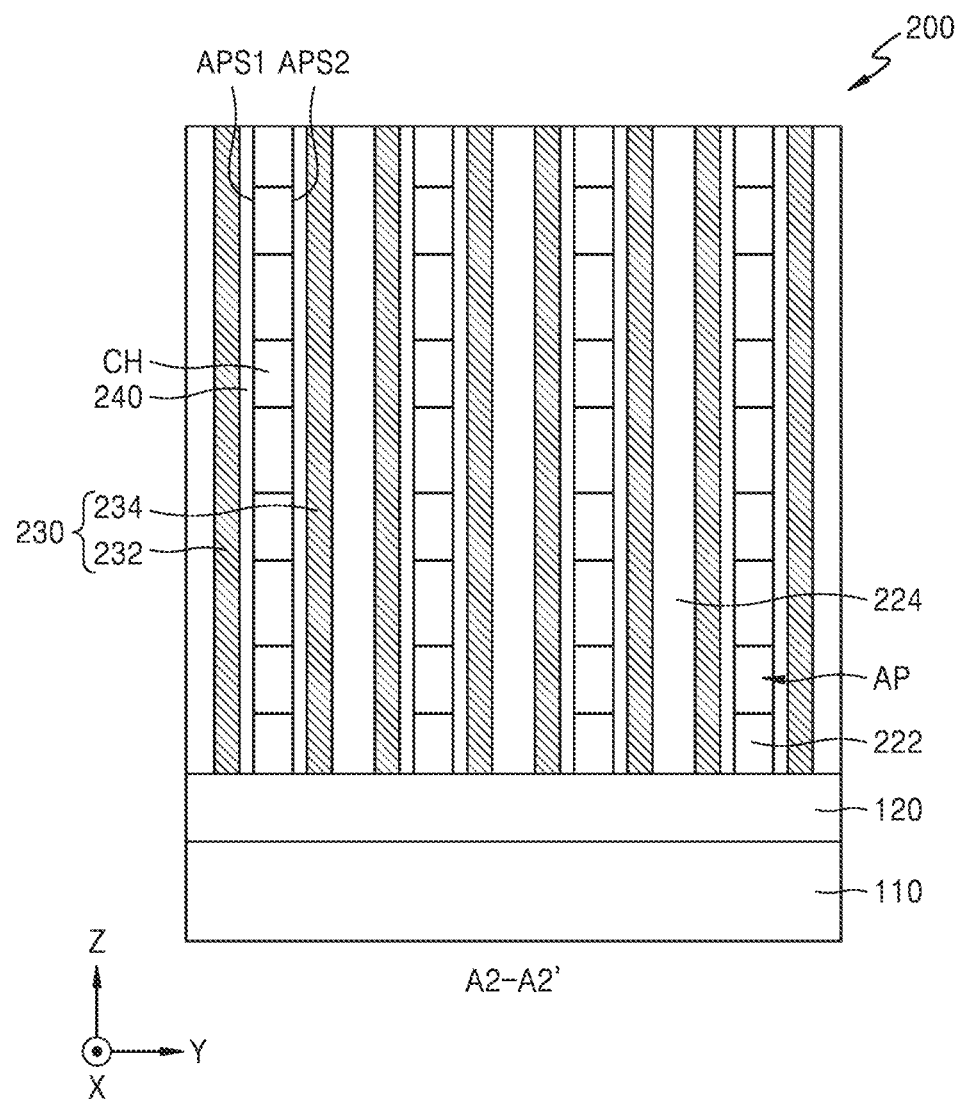
FIG. 13 is a cross-sectional view taken along line A2-A2' of FIG. 11.

FIG. 11 is a perspective view of a semiconductor memory device 200 according to example embodiments. FIG. 12 is a cross-sectional view taken along line A1-A1' of FIG. 11. FIG. 13 is a cross-sectional view taken along line A2-A2' of FIG. 11. In FIGS. 11 to 13, like reference numerals in FIGS. 1 to 10 denote like elements.

Referring to FIGS. 11 to 13, the semiconductor memory device 200 may include the plurality of semiconductor patterns AP, a plurality of word lines 230, a plurality of bit lines 250, and the plurality of resistive switch units RU above the substrate 110.

Above the substrate 110, the plurality of semiconductor patterns AP may extend in the first horizontal direction X and be separated from each other in the vertical direction Z. Each semiconductor pattern AP may include the channel area CH, and the first source/drain area SD1 and the second source/drain area SD2 arranged in the first horizontal direction X with the channel area CH therebetween.

Each of the plurality of resistive switch units RU may include the first electrode BM1, the resistive switch material layer RM, and the second electrode BM2 sequentially arranged in the first horizontal direction X. For example, the first electrode BM1 may be arranged to be connected to the second source/drain area SD2 of the semiconductor pattern AP.

The plurality of semiconductor patterns AP and the plurality of resistive switch units RU may be alternately arranged with a plurality of first mold insulating layers 222 in the vertical direction Z. For example, the plurality of first mold insulating layers 222 may be arranged to be separated from each other in the vertical direction Z, one semiconductor pattern AP and one resistive switch unit RU may be arranged in a row in the first horizontal direction X in a space between two adjacent first mold insulating layers 222 among the plurality of first mold insulating layers 222. In some example embodiments, a height of each of the plurality of resistive switch units RU in the vertical direction Z may be the same as a height of each of the plurality of semiconductor patterns AP in the vertical direction Z. However, in some example embodiments, the height of each of the plurality of resistive switch units RU in the vertical direction Z may be greater than the height of each of the plurality of semiconductor patterns AP in the vertical direction Z.

The plurality of word lines 230 may be arranged to be adjacent to the plurality of semiconductor patterns AP, extend in the vertical direction Z, and be separated from each other in the second horizontal direction Y. Each of the plurality of word lines 230 may include a first gate electrode 232 covering the first side surface APS1 of the channel area CH of each of the plurality of semiconductor patterns AP, and a second gate electrode 234 covering the second side surface APS2 of the channel area CH of each of the plurality of semiconductor patterns AP. The first gate electrode 232 and the second gate electrode 234 may have flat plate shapes extending in the vertical direction Z and separated from each other.

A gate insulating layer 240 may be arranged to extend in the vertical direction Z along the first side surface APS1 and the second side surface APS2 of the channel area CH and both sidewalls of each of the plurality of first mold insulating layers 222 and be between each of the plurality of word lines 230 and the channel area CH.

The plurality of bit lines 250 may be connected to end portions of the plurality of semiconductor patterns AP, extend in the second horizontal direction Y, and be separated from each other in the vertical direction Z. Each of the plurality of first mold insulating layers 222 may be between two adjacent bit lines 250 among the plurality of bit lines 250.

A buried insulating layer 224 may fill a space between two semiconductor patterns AP adjacently arranged in the second horizontal direction Y and a space between two word lines 230 adjacently arranged in the second horizontal direction Y. The buried insulating layer 224 may include a silicon oxide, a silicon oxynitride, a silicon nitride, a carbon-containing silicon oxide, a carbon-containing silicon oxynitride, a carbon-containing silicon nitride, or a combination thereof.

A description of the plurality of resistive switch units RU may refer to the description made above with reference to FIGS. 1 to 6.

The semiconductor memory device 200 according to example embodiments is a three-dimensional semiconductor memory device in which a plurality of memory cells, each including a cell transistor CTR and a resistive switch unit RU, are stacked in the vertical direction Z, and thus, the semiconductor memory device 200 may have a large memory capacity. In addition, a refresh operation is unnecessary to drive a resistive switch unit RU, and thus, the semiconductor memory device 200 may perform a low power operation. In addition, the carbon nanotube bundle CNT included in the resistive switch material layer RM has a high elastic modulus, and thus, when the semiconductor memory device 200 is used as an electronic-mechanical switch, the semiconductor memory device 200 may have remarkably improved durability. In addition, the semiconductor memory device 200 may have an increased on-current by the high electron mobility of the carbon nanotube bundle CNT. Therefore, the semiconductor memory device 200 may have a large memory capacity and excellent operating characteristics.

Figure 14:
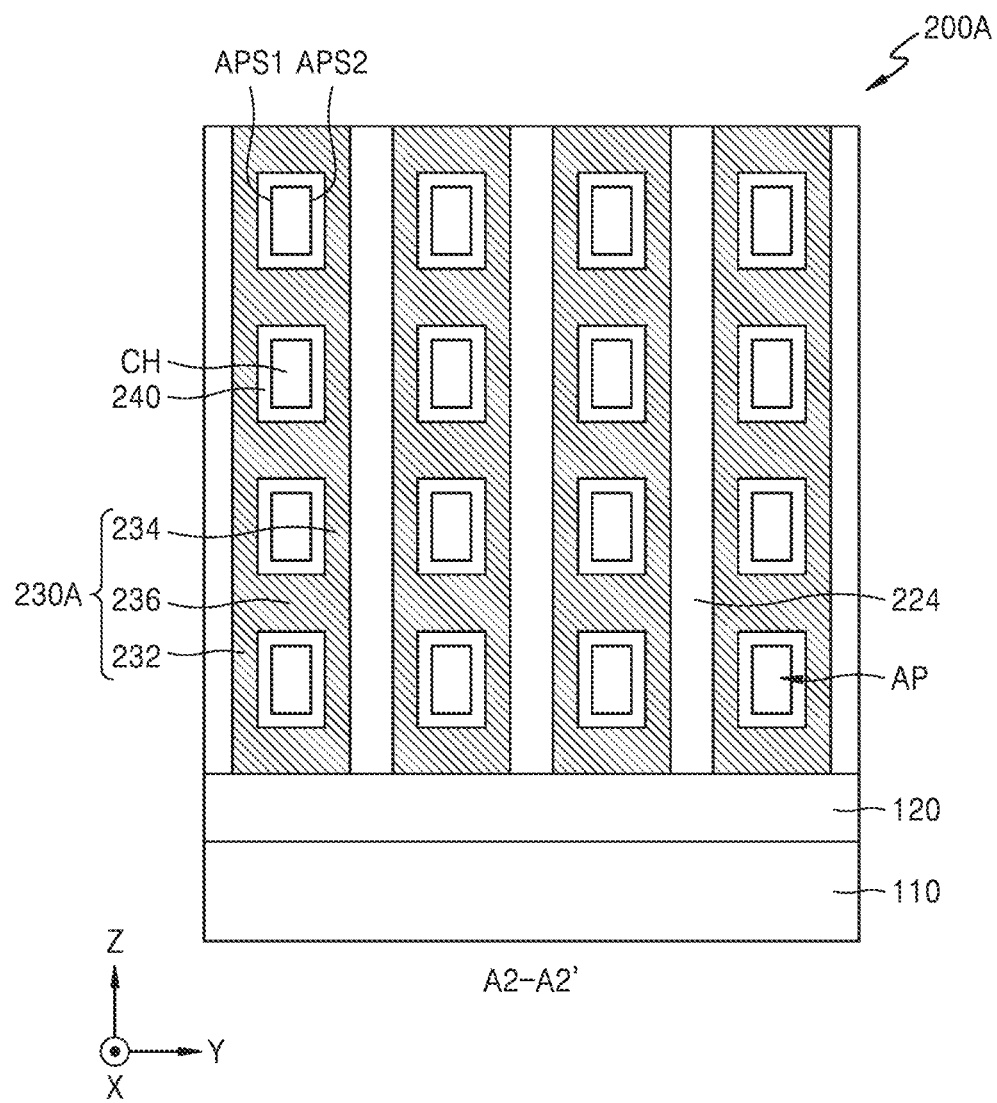
FIG. 14 is a cross-sectional view of a semiconductor memory device according to example embodiments.

FIG. 14 is a cross-sectional view of a semiconductor memory device 200A according to example embodiments. FIG. 14 is a cross-sectional view corresponding to the cross-section taken along line A2-A2' of FIG. 11. In FIG. 14, like reference numerals in FIGS. 1 to 13 denote like elements.

Referring to FIG. 14, each of a plurality of word lines 230A may extend in the vertical direction Z and include the first gate electrode 232, the second gate electrode 234, and a connection part 236. The connection part 236 may be arranged to cover a lower surface and an upper surface of a channel area CH. The connection part 236 may be between the first gate electrode 232 and the second gate electrode 234 and connect the first gate electrode 232 to the second gate electrode 234. Because the plurality of word lines 230A are arranged to surround all of the lower surface, the upper surface, the first side surface APS1, and the second side surface APS2 of the channel area CH, a cell transistor CTR may be referred to as a gate all around-type transistor.

In addition, the gate insulating layer 240 may surround all of the lower surface, the upper surface, the first side surface APS1, and the second side surface APS2 of the channel area CH and be between a word line 230 and the channel area CH.

With reference to FIG. 14, a structure in which each semiconductor pattern AP extends in the first horizontal direction X and each of the plurality of word lines 230A surrounds the semiconductor pattern AP and extends in the vertical direction Z has been described as an example. However, the technical idea of the inventive concepts are not limited thereto. In some example embodiments, the plurality of word lines 230A may have a circular or oval horizontal cross-section and extend in the vertical direction Z, and the plurality of semiconductor patterns AP, each having a circular or ring-shaped horizontal cross-section surrounding a sidewall of a word line 230A, may be arranged to be separated from each other in the vertical direction Z. This structure may be referred to as an inner-gate type.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
   a plurality of semiconductor patterns extending, above a substrate, in a first horizontal direction and separated from each other in a second horizontal direction and a vertical direction, each semiconductor pattern including
      a first source/drain area,
      a channel area, and
      a second source/drain area arranged in the first horizontal direction;
   a plurality of gate insulating layers covering upper surfaces or side surfaces of the channel areas of the plurality of semiconductor patterns;
   a plurality of word lines on the upper surfaces or the side surfaces of the channel areas of the plurality of semiconductor patterns; and
   a plurality of resistive switch units respectively connected to first sidewalls of the plurality of semiconductor patterns, extending in the first horizontal direction, and separated from each other in the second horizontal direction and the vertical direction, each resistive switch unit including
      a first electrode,
      a second electrode, and
      a resistive switch material layer between the first electrode and the second electrode and including carbon nanotubes.

2. The semiconductor memory device of claim 1, further comprising a plurality of mold insulating layers, each being between two resistive switch units adjacent in the vertical direction among the plurality of resistive switch units,
   wherein the resistive switch material layer fills a switch material layer space between two adjacent mold insulating layers among the plurality of mold insulating layers.

3. The semiconductor memory device of claim 2, wherein
   the resistive switch material layer includes a carbon nanotube bundle filling the switch material layer space,
   the carbon nanotube bundle in the switch material layer space is configured to reversibly transit from a first arrangement state to a second arrangement state,
   the first arrangement state is a state in which carbon nanotubes in at least a portion of the carbon nanotube bundle are not in contact with each other, and
   the second arrangement state is a state in which the carbon nanotubes are in close contact with each other.

4. The semiconductor memory device of claim 3, wherein
   the resistive switch material layer in the first arrangement state has a first resistance, and
   the resistive switch material layer in the second arrangement state has a second resistance that is lower than the first resistance.

5. The semiconductor memory device of claim 3, wherein,
   based on a set voltage being applied to the plurality of resistive switch units, the carbon nanotube bundle is configured to transit from the first arrangement state to the second arrangement state, and
   based on a reset voltage being applied to the plurality of resistive switch units, the carbon nanotube bundle is configured to transit from the second arrangement state to the first arrangement state.

6. The semiconductor memory device of claim 5, wherein
   the set voltage is a negative voltage,
   the reset voltage is a positive voltage, and
   a magnitude of the reset voltage is the same as a magnitude of the set voltage.

7. The semiconductor memory device of claim 1, further comprising a plurality of bit lines connected to second sidewalls of the plurality of semiconductor patterns, extending in the vertical direction, and separated from each other in the second horizontal direction,
   wherein each of the plurality of word lines includes a first gate electrode and a second gate electrode respectively on a lower surface and an upper surface of a corresponding semiconductor pattern, and
   wherein the first gate electrode and the second gate electrode extend in the second horizontal direction.

8. The semiconductor memory device of claim 7, wherein the first gate electrode and the second gate electrode, each having a flat plate shape, are separated from each other.

9. The semiconductor memory device of claim 7, wherein
   each of the plurality of word lines further includes a connection part between the first gate electrode and the second gate electrode and on the sidewall of a corresponding semiconductor pattern, and
   each of the plurality of word lines covers the upper surface, the lower surface, and the sidewall of the corresponding semiconductor pattern.

10. The semiconductor memory device of claim 1, further comprising a plurality of bit lines connected to second sidewalls of the plurality of semiconductor patterns, extending in the second horizontal direction, and separated from each other in the vertical direction,
    wherein each of the plurality of word lines includes a first gate electrode and a second gate electrode respectively on a first side surface and a second side surface of a corresponding channel area, and
    wherein the first gate electrode and the second gate electrode extend in the vertical direction.

11. A semiconductor memory device comprising:
    a plurality of semiconductor patterns extending, above a substrate, in a first horizontal direction and separated from each other in a second horizontal direction and a vertical direction, each semiconductor pattern including
       a first source/drain area,
       a channel area, and
       a second source/drain area arranged in the first horizontal direction;
    a plurality of gate insulating layers covering upper surfaces or side surfaces of the channel areas of the plurality of semiconductor patterns;
    a plurality of word lines on the upper surfaces or the side surfaces of the channel areas of the plurality of semiconductor patterns; and
    a plurality of resistive switch units respectively connected to first sidewalls of the plurality of semiconductor patterns, extending in the first horizontal direction, and separated from each other in the second horizontal direction and the vertical direction, each resistive switch unit including
a first electrode,
a second electrode, and
a resistive switch material layer between the first electrode and the second electrode,
wherein the resistive switch material layer includes a carbon nanotube bundle and is configured to transit from a high resistance state to a low resistance state when a set voltage is applied to the plurality of resistive switch units.

12. The semiconductor memory device of claim 11, further comprising a plurality of mold insulating layers, each being between two resistive switch units adjacent in the vertical direction among the plurality of resistive switch units,
wherein the resistive switch material layer fills a switch material layer space between two adjacent mold insulating layers among the plurality of mold insulating layers.

13. The semiconductor memory device of claim 12, wherein
the carbon nanotube bundle in the switch material layer space is configured to reversibly transit from a first arrangement state to a second arrangement state,
the first arrangement state is a state in which carbon nanotubes in at least a portion of the carbon nanotube bundle are not in contact with each other, and
the second arrangement state is a state in which the carbon nanotubes are in close contact with each other.

14. The semiconductor memory device of claim 13, wherein,
based on the set voltage being applied to the plurality of resistive switch units, the carbon nanotube bundle is configured to transit from the first arrangement state to the second arrangement state, and
based on a reset voltage being applied to the plurality of resistive switch units, the carbon nanotube bundle is configured to transit from the second arrangement state to the first arrangement state.

15. The semiconductor memory device of claim 14, wherein
the set voltage is a negative voltage,
the reset voltage is a positive voltage, and
a magnitude of the reset voltage is the same as a magnitude of the set voltage.

16. The semiconductor memory device of claim 11, further comprising a plurality of bit lines connected to second sidewalls of the plurality of semiconductor patterns, extending in the vertical direction, and separated from each other in the second horizontal direction,
wherein each of the plurality of word lines includes a first gate electrode and a second gate electrode respectively on a lower surface and an upper surface of a corresponding semiconductor pattern, and
wherein the first gate electrode and the second gate electrode extend in the second horizontal direction.

17. A semiconductor memory device comprising:
a plurality of semiconductor patterns extending, above a substrate, in a first horizontal direction and separated from each other in a second horizontal direction and a vertical direction, each semiconductor pattern including
a first source/drain area,
a channel area, and
a second source/drain area arranged in the first horizontal direction;
a plurality of gate insulating layers covering lower surfaces and upper surfaces of the channel areas of the plurality of semiconductor patterns;
a plurality of word lines on the lower surfaces and the upper surfaces of the channel areas of the plurality of semiconductor patterns, extending in the second horizontal direction, and extending in the vertical direction;
a plurality of resistive switch units respectively connected to first sidewalls of the plurality of semiconductor patterns, extending in the first horizontal direction, and separated from each other in the second horizontal direction and the vertical direction, each resistive switch unit including
a first electrode,
a second electrode, and
a resistive switch material layer between the first electrode and the second electrode, the resistive switch material layer including a carbon nanotube bundle; and
a plurality of bit lines connected to second sidewalls of the plurality of semiconductor patterns, extending in the vertical direction, and separated from each other in the second horizontal direction.

18. The semiconductor memory device of claim 17, further comprising a plurality of mold insulating layers, each being between two resistive switch units adjacent in the vertical direction among the plurality of resistive switch units,
wherein the resistive switch material layer fills a switch material layer space between two adjacent mold insulating layers among the plurality of mold insulating layers.

19. The semiconductor memory device of claim 18, wherein
the carbon nanotube bundle in the switch material layer space is configured to reversibly transit from a first arrangement state to a second arrangement state,
the first arrangement state is a state in which carbon nanotubes in at least a portion of the carbon nanotube bundle are not in contact with each other, and
the second arrangement state is a state in which the carbon nanotubes are in close contact with each other.

20. The semiconductor memory device of claim 19, wherein,
based on a set voltage being applied to the plurality of resistive switch units, the carbon nanotube bundle is configured to transit from the first arrangement state to the second arrangement state, and
based on a reset voltage being applied to the plurality of resistive switch units, the carbon nanotube bundle is configured to transit from the second arrangement state to the first arrangement state.

* * * * *